United States Patent
Unno et al.

(10) Patent No.: US 7,728,340 B2
(45) Date of Patent: Jun. 1, 2010

(54) SEMICONDUCTOR LIGHT-EMITTING DEVICE

(75) Inventors: Tsunehiro Unno, Tsuchiura (JP); Katsuya Akimoto, Tsuchiura (JP); Masahiro Arai, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 422 days.

(21) Appl. No.: 11/484,603

(22) Filed: Jul. 12, 2006

(65) Prior Publication Data

US 2007/0145381 A1   Jun. 28, 2007

(30) Foreign Application Priority Data

Dec. 22, 2005   (JP) ............... 2005-369243

(51) Int. Cl.
*H01L 31/0232* (2006.01)
(52) U.S. Cl. ............... 257/98; 257/79; 257/E33.124; 257/E33.127
(58) Field of Classification Search ............... 257/79, 257/E33.068, 98, 86, 87, E33.124, E33.127
See application file for complete search history.

(56) References Cited

U.S. PATENT DOCUMENTS

| | | | | |
|---|---|---|---|---|
| 5,696,389 | A * | 12/1997 | Ishikawa et al. | 257/99 |
| 6,794,688 | B2 * | 9/2004 | Nakatsu et al. | 257/98 |
| 7,145,180 | B2 * | 12/2006 | Shinohara et al. | 257/85 |
| 7,180,094 | B2 * | 2/2007 | Seong et al. | 257/59 |
| 7,285,436 | B2 * | 10/2007 | Nakatsu et al. | 438/38 |
| 2001/0011730 | A1 * | 8/2001 | Saeki | 257/79 |
| 2005/0205886 | A1 * | 9/2005 | Murofushi et al. | 257/98 |
| 2005/0236632 | A1 * | 10/2005 | Lai et al. | 257/94 |
| 2009/0072257 | A1 * | 3/2009 | Unno et al. | 257/98 |

FOREIGN PATENT DOCUMENTS

JP       2001-144322       5/2001

\* cited by examiner

*Primary Examiner*—Davienne Monbleau
*Assistant Examiner*—Eduardo A Rodela
(74) *Attorney, Agent, or Firm*—McGinn IP Law Group, PLLC (57) ABSTRACT

A light-emitting diode has: a substrate; a light-emitting layer having a first conductivity type cladding layer, an active layer, and a second conductivity type cladding layer stacked sequentially on a front side of the substrate; a first current-blocking portion partially formed in the middle on the light-emitting layer; a current-conducting portion formed on the second conductivity type cladding layer and the first current-blocking portion; a lower electrode formed on the back side of the substrate, a light-reflecting layer formed between the substrate and the light-emitting layer; a partial electrode formed on the surface of the light-reflecting layer and in a portion positioned below the first current-blocking portion; and a second current-blocking portion formed over the surface of the light-reflecting layer excluding the portion in which is formed the partial electrode.

11 Claims, 7 Drawing Sheets

SEMICONDUCTOR LIGHT-EMITTING DEVICE

The present application is based on Japanese patent application No. 2005-369243, the entire contents of which are incorporated herein by reference.

BACKGROUND OF THE INVENTION

1. Field of the Invention

The present invention relates to a light-emitting diode, and particularly, to a light-emitting diode capable of conducting large electric current with high efficiency.

2. Description of the Related Art

In recent years, attempts have been positively made to apply light-emitting diodes to illumination because red to blue colors have been completed, and light-emitting efficiency of light-emitting diodes can finally be obtained to be equal to light-emitting efficiency of bulbs.

On the other hand, the conducting current of utility light-emitting diodes is generally 20 mA, but one light-emitting diode only serves as a light-emitting source on the order of a few tens of mW. To obtain brightness of the order of a few tens of W as in bulbs, plural light-emitting diodes are connected in parallel or series to each other, to obtain brightness needed. In traffic lights, for example, about 200 light-emitting diodes arranged on the plane for one bulb are used as a lamp. Accordingly, to widely use light-emitting diodes for illumination, it is required that light-emitting efficiency is higher, and that conducting large current is possible, rather than that energy consumption and cost are reduced.

Conventional light-emitting diodes are very easily affected by heat in comparison to conventional lamps such as bulbs, fluorescent lamps, etc. Heat caused during large electrical conduction through the light-emitting diodes degrades light-emitting efficiency and reliability. To avoid this, there are methods for rapidly dissipating heat caused to a stem, or for preventing generation of heat as much as possible.

Figure 9:
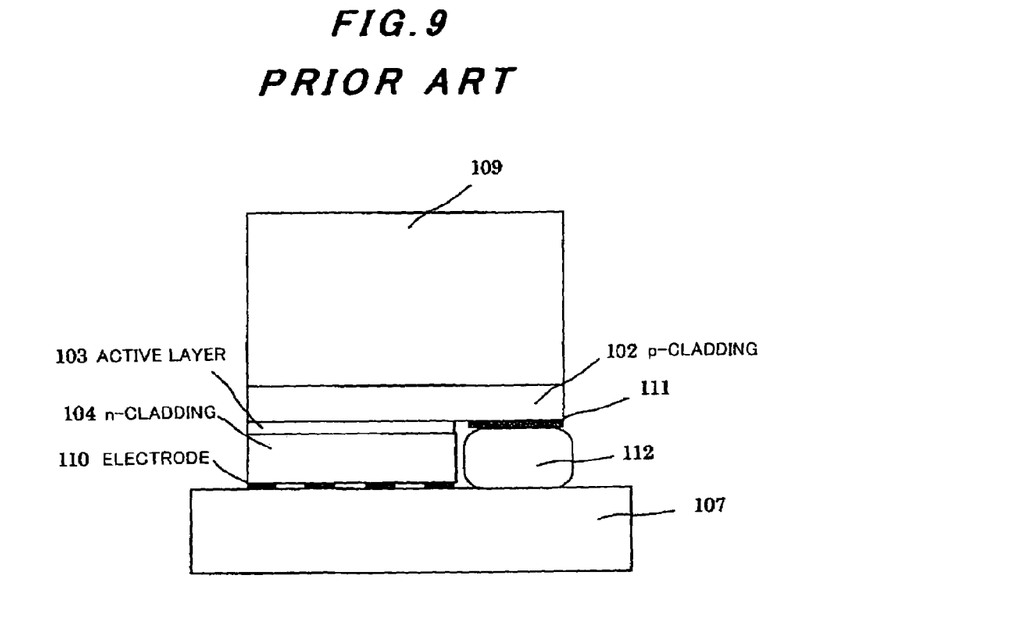
FIG. 9 is a cross-sectional view of a conventional light-emitting diode.

The method for rapidly dissipating heat caused is as follows: Flip-chip structure is formed as in FIG. 9, which comprises a light-permeable substrate 109 having an extracting surface on its front side; a light-emitting layer having a p-type cladding layer 102, an active layer 103, and an n-type cladding layer 104 on the back side of the substrate 109; a packaging stem 107; an electrode 110 for the n-type cladding layer 104; an electrode 111 for the p-type cladding layer 102; and a packaging alloy 112, wherein current is injected from the electrode 110 for the n-type cladding layer 104 and the electrode 111 for the p-type cladding layer 102 bonded to the packaging stem 107 via the packaging alloy 112, and wherein the light-emitting layer that is a heat-generating portion is positioned as close to the packaging stem 107 as possible. However, in this flip-chip structure, although heat caused in the light-emitting layer can be dissipated efficiently to the packaging stem 107, there is the problem with thermal resistance between the heat-generating light-emitting layer and the heat-dissipating substrate.

Figure 10:
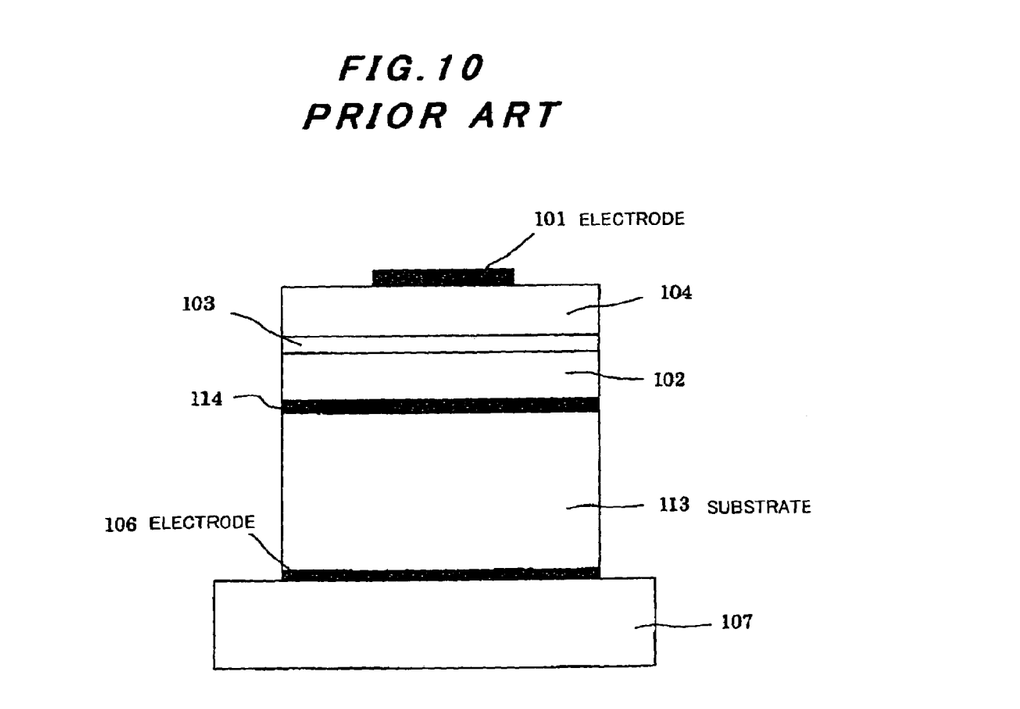
FIG. 10 is a cross-sectional view of a conventional light-emitting diode.

Accordingly, as shown in FIG. 10, a light-emitting layer comprising an n-type cladding layer 104, an active layer 103, and a p-type cladding layer 102 is first grown over a high thermal-resistive substrate (not shown), and laminated with a low-thermal-resistive high-thermal-conductive substrate 113 via a semiconductor bonding layer 114, followed by removal of the high thermal-resistive substrate, and subsequent formation of upper and lower electrodes 101 and 106. A Si substrate is most widely used as the high-thermal-conductive substrate 113 used in FIG. 10. Also used is a substrate which uses CuW, etc. from a linear expansion coefficient relationship.

On the other hand, to prevent generation of heat as much as possible, light-emitting efficiency of light-emitting diodes has to be made high, and electrical energy converted into light as much as possible for extraction, so as not to be converted into heat. In other words, it is required that internal quantum efficiency for efficiently recombining electrons and holes injected is made as high as possible, and further, that light-extracting efficiency for extracting light emitted from light-emitting diodes is made high.

In the light-emitting diode of FIG. 10, however, of light emitted from the light-emitting layer to the front surface, a portion of the light is released to outside of the light-emitting diode, but from a difference between the refractive index of the surface of the light-emitting diode and the refractive index of the outside of the light-emitting diode, most of the light is reflected at the surface of the light-emitting diode, so that light passed towards the high-thermal-conductive substrate 113 reaches the bonding layer 114 at the interface of the light-emitting layer and the high-thermal-conductive substrate 113, where some of the light is reflected and the other is absorbed. If the light reflectance at the bonding layer 114 is high, light reflected is passed to the front surface, and a portion of the light is released to the outside of the device, while the remaining light is again reflected. Light can be extracted by repeating such reflection. However, because it is also required that the bonding layer 114 conducts electricity, its reflectance cannot be made very high. In other words, there is a tradeoff between light reflectance and electrical conductance.

Figure 11:
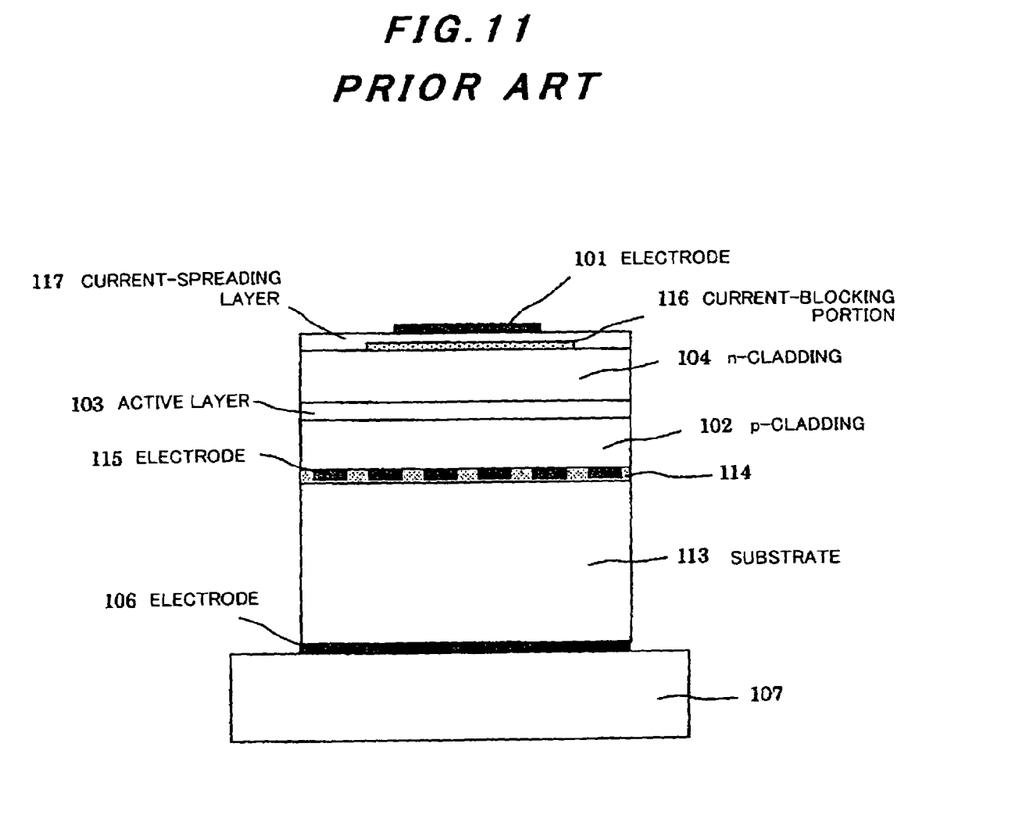
FIG. 11 is a cross-sectional view of a conventional light-emitting diode.

To circumvent this, as shown in FIG. 11, there is the method of separately forming the current-conducting partial electrode 115 and the light-reflecting bonding layer 114 in the light-emitting diode of FIG. 10 (See JP-A-2001-144322, for example). Further, directly below the light-impermeable upper electrode 101 is formed a current-blocking portion 116, to spread current to the periphery of the upper electrode 101 and thereby prevent light from being emitted directly below the upper electrode 101, to enhance light-emitting efficiency.

In the structure of FIG. 11, however, while the driving voltage can be controlled to be low by increasing the current-conducting area of the partial electrode 115, because the area of the bonding layer 114 is decreased, there is the problem of a decrease in reflectance and therefore in light-emitting efficiency. In other words, in the structure of FIG. 11, there is difficulty in balancing the tradeoff between high reflectance and low electrical resistance.

SUMMARY OF THE INVENTION

Accordingly, it is an object of the present invention to provide a light-emitting diode, which is capable of obviating the above problem, and of conducting large electric current with high light-emitting efficiency.

(1) According to one aspect of the invention, a light-emitting diode comprises:

a substrate;

a light-emitting layer comprising at least a first conductivity type cladding layer, an active layer, and a second conductivity type cladding layer stacked sequentially on a front side of the substrate;

a first current-blocking portion partially formed in the middle on the light-emitting layer;

a current-conducting portion formed on the second conductivity type cladding layer and the first current-blocking portion;

a lower electrode formed on the back side of the substrate, a light-reflecting layer formed between the substrate and the light-emitting layer;

a partial electrode formed on the surface of the light-reflecting layer and in a portion positioned below the first current-blocking portion; and a second current-blocking portion formed over the surface of the light-reflecting layer excluding the portion in which is formed the partial electrode.

(2) According to another aspect of the invention, a light-emitting diode comprises:

a substrate having a light-extracting portion on its front side;

a light-emitting layer comprising at least a first conductivity type cladding layer, an active layer, and a second conductivity type cladding layer stacked sequentially on the back side of the substrate;

a current-blocking portion formed in a side portion on the back side of the second conductivity type cladding layer;

a current-spreading layer formed on the back side of the current-blocking portion and the second conductivity type cladding layer;

a current-injecting electrode formed on the back side of the current-spreading layer so as to face the current-blocking portion; and a light-reflecting layer formed on the back side of the current-spreading layer excluding the portion in which is formed the current-injecting electrode.

In the above invention (1) or (2), the following modifications and changes can be made.

(i) The sheet resistance of the second conductivity type cladding layer is higher than that of the first conductivity type cladding layer.

(ii) The light-reflecting layer comprises a layer formed of an alloy containing any or at least one of Ag, Au, and Al, or a composite layer thereof.

(iii) The active layer has multi-quantum-well structure.

In the above invention (1), the following modifications and changes can be made.

(iv) The current-conducting portion comprises a current-spreading layer provided over the first current-blocking portion and the second conductivity type cladding layer, and an upper electrode provided on the current-spreading layer.

(v) The current-conducting portion comprises a branching electrode provided to come into contact with the surface of the first current-blocking portion and the second conductivity type cladding layer.

(vi) The current-conducting portion comprises a branching electrode provided so as to come into contact with the surface of the first current-blocking portion and the second conductivity type cladding layer, and a current-spreading layer provided on the second conductivity type cladding layer so as to expose a portion of the surface of the branching electrode.

(vii) The current-conducting portion comprises a branching electrode provided so as to come into contact with the surface of the first current-blocking portion and the second conductivity type cladding layer, a current-spreading layer provided over the second conductivity type cladding layer and the branching electrode, and an upper electrode provided on the current-spreading layer.

In the above invention (2), the following modifications and changes can be made.

(viii) The current-spreading layer comprises a transparent conductive film.

ADVANTAGES OF THE INVENTION

The light-emitting diode according to the present invention is capable of stably attaining high optical output, while controlling driving voltage to be low even in the case of large electrical conduction.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
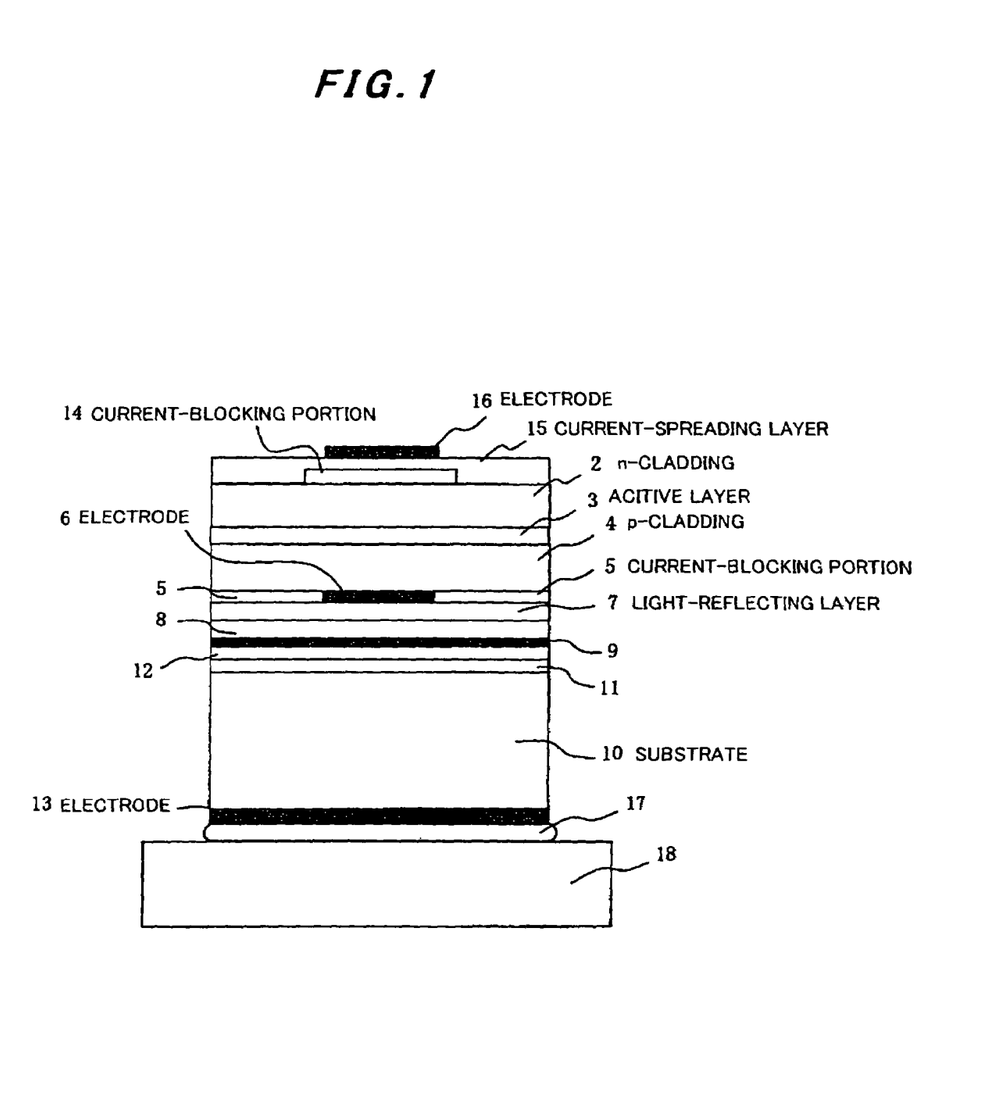
FIG. 1 is a cross-sectional view of an AlGaInP light-emitting diode according to a first embodiment of the present invention.

FIG. 1 shows a cross-sectional structure of an AlGaInP light-emitting diode according to a first embodiment of the present invention. The light-emitting diode device is 1 mm×1 mm sized and 250 μm thick. Procedures for making the light-emitting diode of FIG. 1 will be explained below by reference to FIGS. 2A-2D.

Figure 2A:
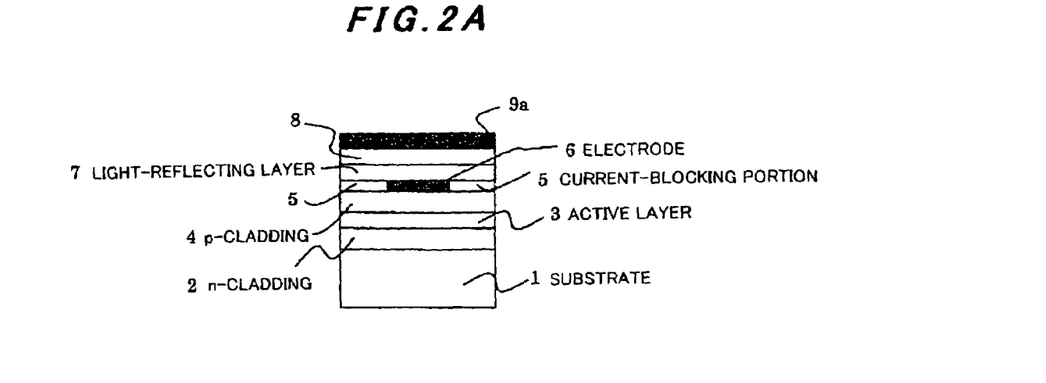
FIGS. 2A-2D are respectively diagrams showing a process for making the AlGaInP light-emitting diode in FIG. 1.

First, as shown in FIG. 2A, by using MOCVD method, on an n-type GaAs substrate 1, an n-type AlGaInP cladding layer (hereinafter, n-type cladding layer) 2, an active layer 3, and a p-type AlGaInP cladding layer (hereinafter, p-type cladding layer) 4 are sequentially stacked. Here, the sheet resistance of the n-type cladding layer 2 is made higher than the sheet resistance of the p-type cladding layer 4. By using CVD method, over the entire surface of the p-type cladding layer 4, a current-blocking portion 5 made of $SiO_2$ is formed. Subsequently, photolithography is used to cut, in the current-blocking portion 5, 120 μm-diameter holes spaced at an interval of 1050 μm in a matrix form, to expose the p-type cladding layer 4. Next, by using photolithography and deposition, in exposed portions of this p-type cladding layer 4, a film made of AuBe and Ni_is stacked and formed, followed by annealing to form a partial electrode 6. Further, over the layer comprising the current-blocking portion 5 and the partial electrode 6, a light-reflecting layer 7 made of an Ag alloy (marketed as APC, FURUYA METAL Co., Ltd.), a diffusion-inhibiting layer 8 made of Ti, and a bonding layer 9a made of Au or AuSn are deposited and formed.

Figure 2B:
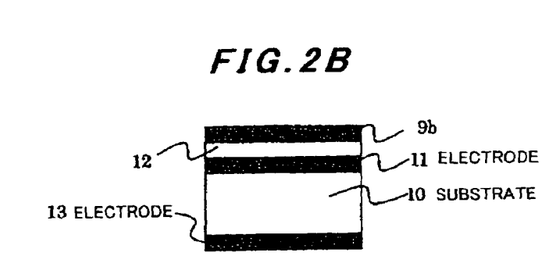

As shown in FIG. 2B, on the other hand, on the front side of a high thermal-conductivity substrate 10 made of Si, an electrode 11 for the high thermal-conductivity substrate 10 is deposited, while on the back side of the high thermal-conductivity substrate 10, a lower electrode 13 made of Al is deposited. Then, on the electrode 11 for the high thermal-conductivity substrate, a diffusion-inhibiting layer 12 made of Ti and a bonding layer 9b made of Au or AuSn are sequentially deposited and formed.

The above two wafers made are set in a bonding apparatus. This apparatus is available in the market for SOI substrate manufacture and micromachines. The high thermal-conductivity substrate 10 is set in a lower wafer holder of the bonding apparatus so that the bonding layer 9b is on the upper side. Also, the GaAs substrate 1 side wafer is set in an upper wafer holder of the bonding apparatus so that the bonding layer 9a is on the lower side. These two wafer setting is followed by evacuation of the bonding apparatus. After the evacuation, the respective bonding layers 9a and 9b of the two wafers are brought into contact with each other, and directly pressurized to form together a bonding layer 9. In this case, pressure is sufficient which brings the respective entire surfaces of the warped wafers into contact with each other but which does not have to bond the two wafers together. With these two wafers set in the wafer holders respectively, current is conducted through a heater, to heat them up to 350° C. while controlling the temperature thereof. This is held for one hour, and thereafter cooling thereof is started. When the temperature of the wafers is decreased below 50° C., air is introduced into the vacuum container and the lid of the bonding apparatus is opened to take out the bonded wafer.

Figure 2C:
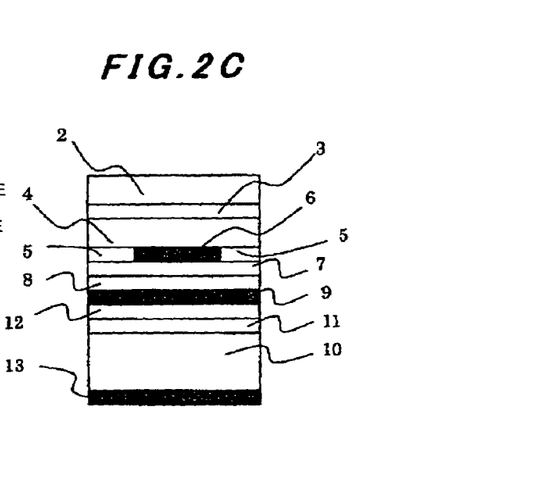

This bonded wafer is mounted to a grinding jig so that its GaAs substrate 1 is on the upper side, to grind and remove a portion of the GaAs substrate 1, to detach the wafer from the grinding jig. Subsequently, the remaining portion of the GaAs substrate 1 is etched and removed to cause the n-type cladding layer 2 to appear from the surface of the wafer. During the etching, the lower electrode 13 on the backside is protected from being melted (FIG. 2C).

Figure 2D:
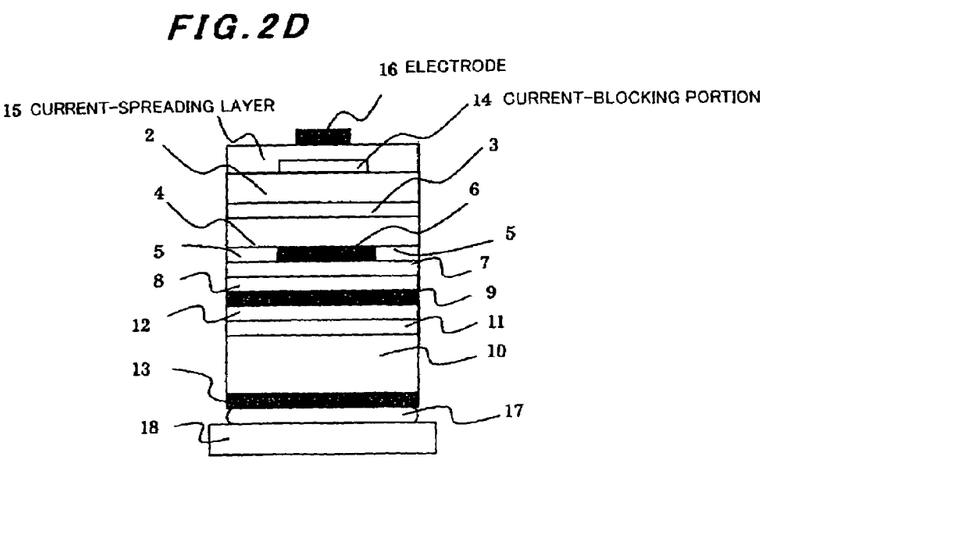

As shown in FIG. 2D, on the n-type cladding layer 2 of this bonded wafer, a current-blocking portion 14 made of $SiO_2$ is formed. By using photolithography, this current-blocking portion 14 is patterned so that 420 μm-diameter circles are spaced at an interval of 1050 μm in a matrix form. It should be noted that, during this photolithographic process, the patterning is such that the center of the circular current-blocking portion 14 is aligned with the center of the partial electrode 6. Subsequently, by_using sputtering, over the surfaces of the n-type cladding layer 2 and the current-blocking portion 14 of this wafer, a current-spreading layer 15 made of ITO is formed. Subsequently, using deposition and photolithography, a circular upper electrode 16 is formed so that its center is aligned with the center of the circular current-blocking portion 14.

In this case, although heat treatment is performed in the above bonding and upper electrode 16 formation, this heat treatment causes metal to diffuse from the junction layer 9, and if the metal diffuses into the light-reflecting layer 7, an alloying reaction is caused to reduce light reflectance. To inhibit this alloying reaction, the diffusion-inhibiting layer 8 and the diffusion-inhibiting layer 12 are provided.

The wafer made as above is set in a dicer to dice it into a 1 mm square chip, and etch and remove from the cross section thereof broken layers and contamination to make a light-emitting diode. Subsequently, the light-emitting diode device is eutectically die-bonded via a packaging alloy 17 to an excellent dissipative packaging system 18, and wire-bonded to a packaging system (not shown) separated from the packaging system 18, to make a sample for property evaluation.

Figure 3:
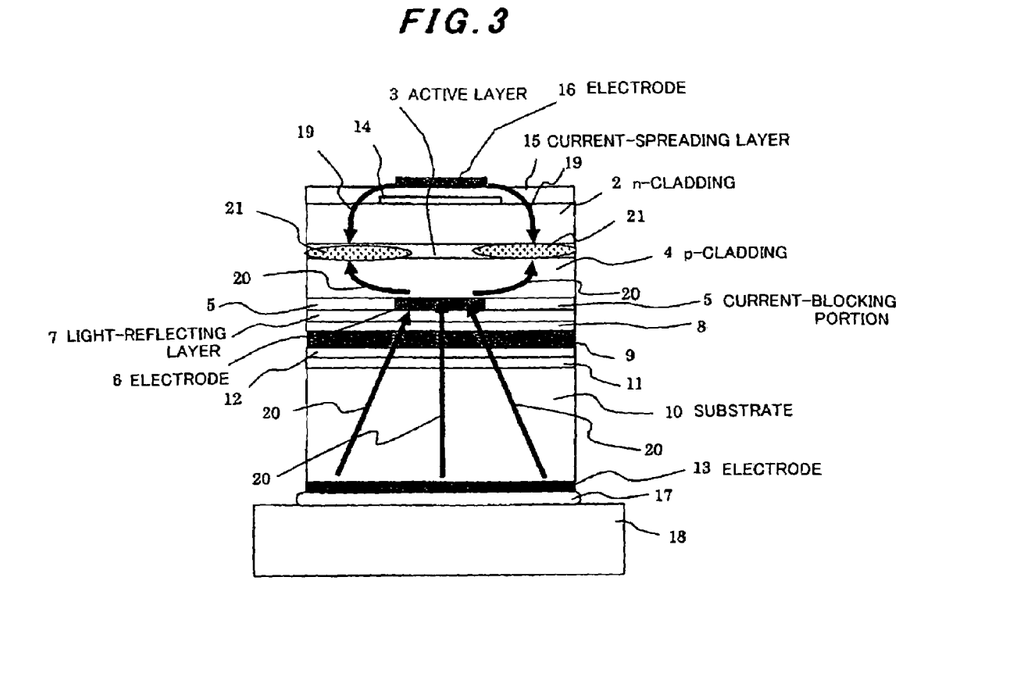
FIG. 3 is a diagram showing current flow through the AlGaInP light-emitting diode in FIG. 1.

FIG. 3 shows current flow through the light-emitting diode fabricated above. The current-blocking portion 14 causes electrons 19 injected from the upper electrode 16 to flow to the periphery of the device. On the other hand, the current-blocking portion 5 causes holes 20 injected from the lower electrode 13 to be injected into the partial electrode 6 formed in the middle portion. The sheet resistance of the n-type cladding layer 2 is made higher than the sheet resistance of the p-type cladding layer 4, so as to choose the shortest current path in the n-type cladding layer 2 and cause current to flow to the periphery of the active layer 3, to thereby emit light in a light-emitting portion 21. For this reason, no interruption is caused by the upper electrode 16, thus the emitted light to be taken out efficiently. Conversely, in case the sheet resistance of the n-type cladding layer 2 is made lower than the sheet resistance of the p-type cladding layer 4, current which flows directly below the upper electrode 16 is increased, which results in an increase of the ratio of emitting light there, and a decrease of light-emitting efficiency due to interruption caused by the upper electrode 16. Also, the partial electrode 6 is ohmically bonded to conduct current. If neither the partial electrode 6 nor the current-blocking portion 5 is provided, a potential barrier is caused between the p-type cladding layer 4 and the light-reflecting layer 7, which results in no electrical conduction.

Current is conducted through the above sample for property evaluation to measure light emission output. The light emission wavelength is 630 nm red. As a result, the current and light emission output exhibit substantially linearity until when the current becomes 500 mA. This is because use of high thermal-conductivity material for the substrate allows heat caused in the light-emitting diode device to be efficiently dissipated to the packaging system 18, so that the temperature in the light-emitting diode device does not become high even in the event of large electrical conduction, and the decrease of photoelectric conversion efficiency in the active layer 3 is inhibited. Also, the light emission output at the conducting current of 350 mA, for example, is 410 mW, which corresponds to approximately 60% as external quantum efficiency. This allows the current-blocking portion 14 to suppress light emission directly below the upper electrode 16, and of light efficiently converted from electricity in a light-emitting portion 21, light radiated to the backside of the light-emitting diode device is efficiently reflected by the light-reflecting layer 7 using a high reflectance Ag alloy, which can result in high external quantum efficiency. Also, because the partial electrode 6 and the light-reflecting layer 7 are independent of each other, it is not necessary to balance the tradeoff between light reflectance and electrical conductance as in the prior art, in other words, no decrease of light reflectance is caused even when conducting current is increased, thus making it possible to provide a high efficiency light-emitting diode in large electrical conduction.

Second Embodiment

Figure 4:
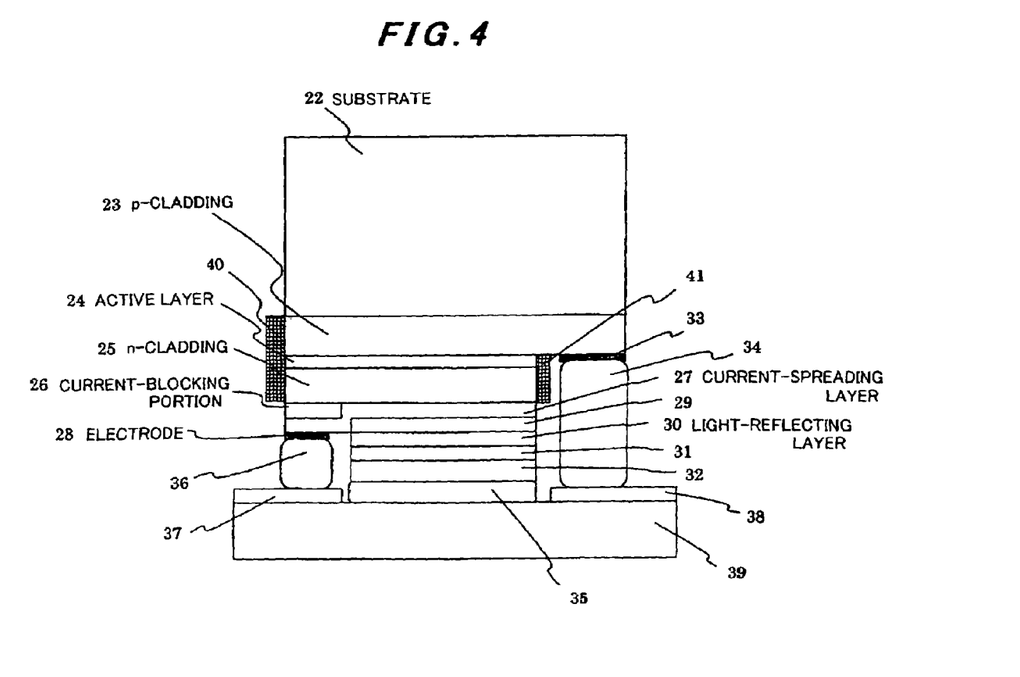
FIG. 4 is a cross-sectional view of an AlGaInP light-emitting diode according to a second embodiment of the present invention.

FIG. 4 shows a cross-sectional structure of a flip chip type light-emitting diode according to a second embodiment of the present invention.

Under a light-permeable substrate 22 made of transparent material to light, a light-emitting layer comprising a p-type cladding layer 23, an active layer 24, and an n-type cladding layer 25 is placed. Similarly to the first embodiment, the sheet resistance of the n-type cladding layer 25 is made higher than the sheet resistance of the p-type cladding layer 23. As material of the light-permeable substrate 22, besides glass, sapphire or SiC, GaP may be used in the case of red or yellow light-emitting diodes. And, the active layer 24 and the n-type cladding layer 25 are partially removed, to partially expose the p-type cladding layer 23. On this exposed portion of the p-type cladding layer 23, an electrode 33 for the p-type cladding layer is formed. Also, in a portion of the n-type cladding layer 25, a current-blocking portion 26 is provided. A current-spreading layer 27 made of a transparent conductive ITO film is formed to cover both the current-blocking portion 26 and the n-type cladding layer 25. In a lower portion of the current-spreading layer 27 and directly below the current-blocking portion 26, an electrode 28 for the current-spreading layer is formed which is smaller-sized than the current-blocking portion 26. Below the current-spreading layer 27 and in a portion excluding directly below the current-blocking portion 26, a light-reflecting layer 30 made of a high-reflectance Ag alloy (marketed as APC, FURUYA METAL Co., Ltd.) is formed. Here, to make light reflectance higher, it would be better that an insulating layer 29 is formed between the n-type cladding layer 25 and the light-reflecting layer 30, so as not to cause a reaction between the n-type cladding layer 25 and the light-reflecting layer 30 during a heating process, which decreases the light reflectance.

Also, bonding to a packaging system 39 is performed via a heat-dissipating bonding solder 35 to efficiently dissipate heat of the light-emitting layer in a lower portion of the light-reflecting layer 30, to handle large electrical conduction. In this case, on the light-emitting diode device side, a heat-dissipating bonding layer 32 for good soldering of the heat-dissipating bonding solder 35 is formed. Further, between this heat-dissipating bonding layer 32 and the light-reflecting layer 30, a diffusion-inhibiting layer 31 is formed, so as not to cause an alloying reaction between them at high temperatures during the wafer process or packaging process, which reduces reflectance of the light-reflecting layer 30. The electrode 28 for the current-spreading layer is bonded via a conducting bonding solder 36 and a stem wiring pattern 37 to a packaging system 39. The electrode 33 for the p-type cladding layer is bonded via a conducting bonding solder 34 and a stem wiring pattern 38 to the packaging system 39. Protective films 40 and 41 are respectively formed on sides of the light-emitting layer so as not to bring solder into contact with the light-emitting layer during this packaging, and form a leak path. By the above packaging, high thermal dissipation can be achieved.

In the light-emitting diode of the second embodiment of the present invention, the current-blocking portion 26 is formed directly above the electrode 28 for the current-spreading layer so that the light-emitting layer is positioned in the upper portion of the light-reflecting layer 30, and the sheet resistance of the n-type cladding layer 25 is made higher than the sheet resistance of the p-type cladding layer 23. Further, because the light-reflecting layer 30 is formed for only the purpose of making light reflectance high, it is possible to provide the light-emitting diode with very high light reflectance even in the case of large electrical conduction, and which has high light-extracting efficiency. In contrast, in the conventional flip-chip light-emitting diode shown in FIG. 9, because the electrode 110 for the n-type cladding layer formed in the lower portion of the n-type cladding layer 104 has to work both as the electrode to flow the current, and as the light-reflecting layer for reflecting light, achieving high light reflectance is difficult, and light-extracting efficiency decreases.

Third Embodiment

Figure 5:
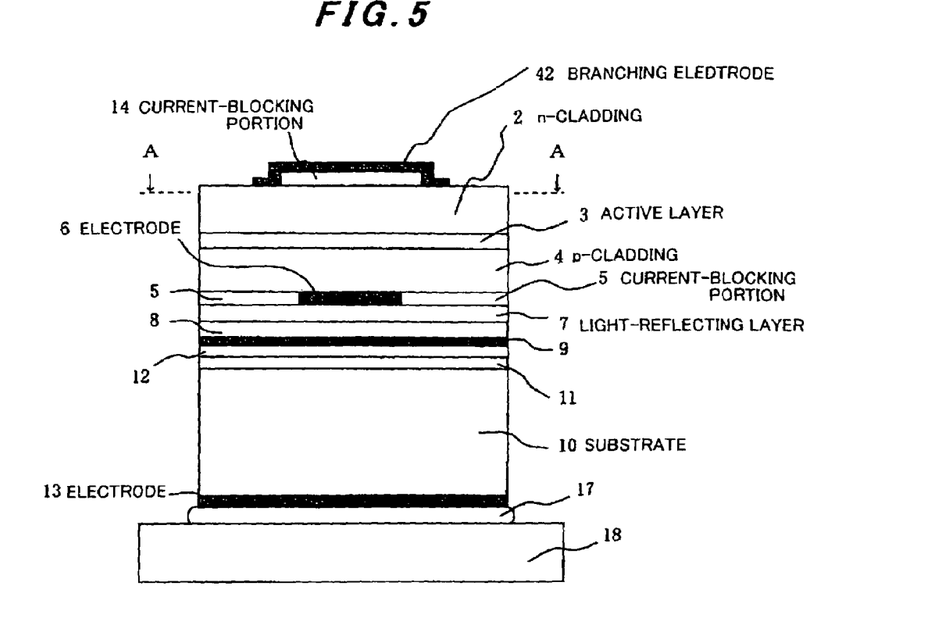
FIG. 5 is a cross-sectional view of an AlGaInP light-emitting diode according to a third embodiment of the present invention.
Figure 6A:
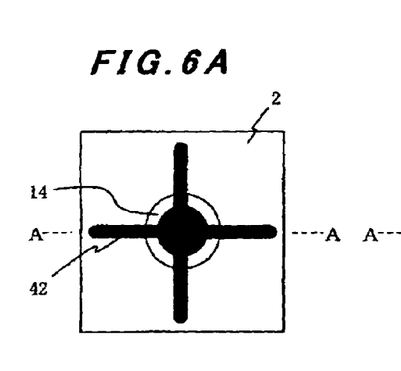
FIGS. 6A-6D are respectively cross-sectional views cut along a line A-A in FIG. 5.
Figure 6B:
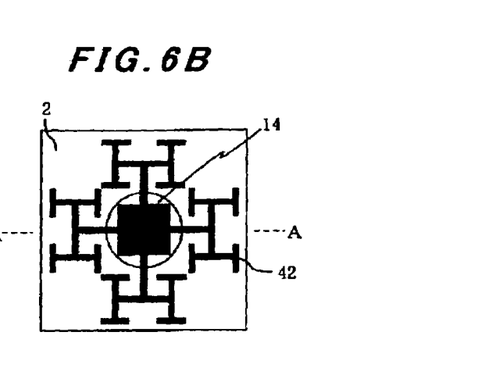
Figures 6C, 6D:
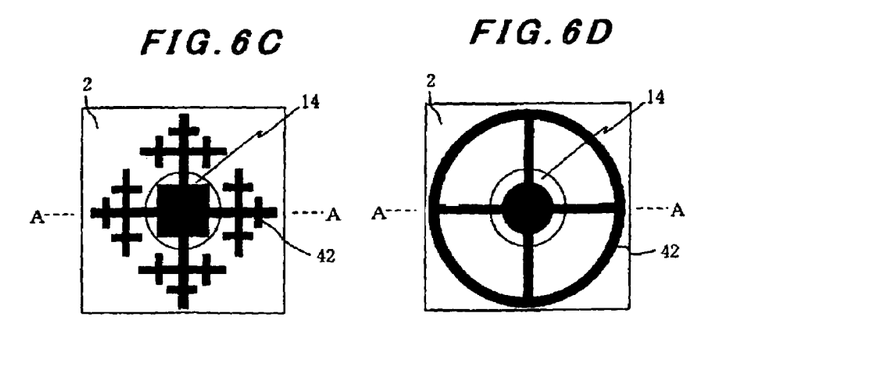

Although in the first embodiment of the present invention, the current-spreading layer 15 is provided between the n-type cladding layer 2 and the circular upper electrode 16, a branching electrode 42 may, without the current-spreading layer, be ohmically bonded directly on the current-blocking portion 14 and to a portion of the surface of the n-type cladding layer 2, as shown in FIG. 5. In the structure of FIG. 5, because current injected is spread by the branching electrode 42, it is not necessary to form a current-spreading layer, and manufacturing cost can be lower than that of the first embodiment. FIG. 6A-6D show the light-emitting diode of FIG. 5 viewed from the branching electrode 42 side. The above branching electrode 42 may be in any form of FIGS. 6A-6D, and be in any form other than this form, which can effectively spread current.

Fourth Embodiment

Figure 7:
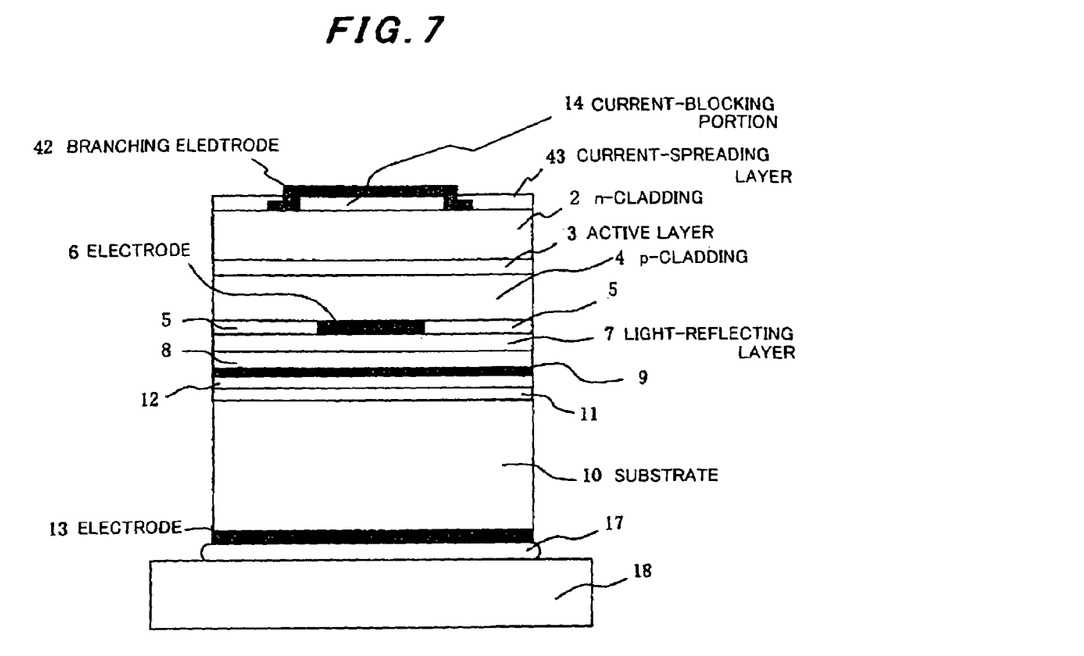
FIG. 7 is a cross-sectional view of an AlGaInP light-emitting diode according to a fourth embodiment of the present invention.

Further, FIG. 7 shows that in the structure of FIG. 5, a current-spreading layer 43 is provided on the n-type cladding layer 2 so as to expose a portion of the surface of the branching electrode 42. This structure allows light diffusely reflected in the light-emitting layer, which cannot be extracted in FIG. 5, to be extracted efficiently to outside from portion of the current-spreading layer 43. In this case, a transparent conductive film of ITO or the like is used as material of the current-spreading layer 43.

Fifth Embodiment

Figure 8:
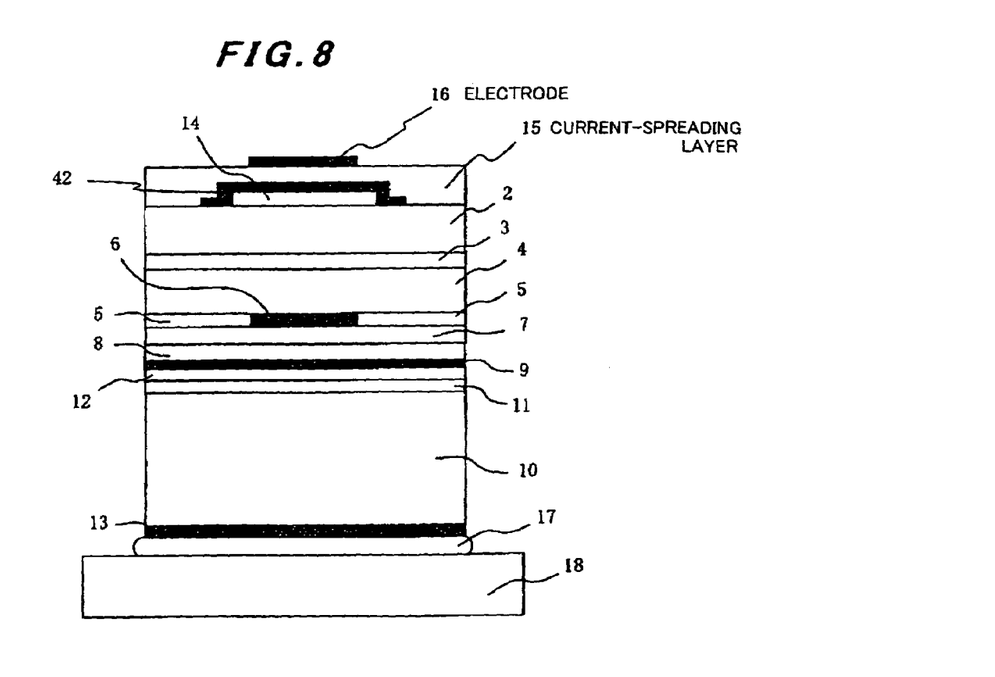
FIG. 8 is a cross-sectional view of an AlGaInP light-emitting diode according to a fifth embodiment of the present invention.

Although in the first embodiment of the present invention, only the circular upper electrode 16 is provided on the surface of the current-spreading layer 15, the branching electrode 42 used in FIG. 5 may, in addition to this upper electrode 16, be ohmically bonded directly on the current-blocking portion 14 and a portion of the surface of the n-type cladding layer 2, as shown in FIG. 8, to thereby allow current injected from the upper electrode 16 to be spread effectively.

In each embodiment of the present invention, the active layer may have multi-quantum-well structure, in which are alternately stacked barrier layers, which comprise large band gap thin film semiconductor layers, and well layers, which comprise small band gap thin film semiconductor layers, and whereby it is also possible to have similar effects.

Although in each embodiment of the present invention, the sheet resistance of the n-type cladding layer is made higher than the sheet resistance of the p-type cladding layer, effects similar to those of the embodiments of the present invention can also be obtained by a multilayered p-type cladding layer comprising combined low sheet resistance semiconductor layers whose overall sheet resistance is lower than the sheet resistance of the n-type cladding layer.

Although in each embodiment of the present invention, the transparent conductive film of ITO is used as the current-spreading layer, effects similar to those of the embodiments of the present invention can also be obtained by use of a transparent conductive film other than ITO.

Although the first embodiment of the present invention uses the circular upper electrode 16, effects similar to those of the first embodiment of the present invention can also be obtained by using a branching electrode as this upper electrode 16.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light-emitting diode, comprising:
    a substrate;
    a light-emitting part formed on a front side of the substrate, the light-emitting part comprising a first conductivity type cladding layer, an active layer, and a second conductivity type cladding layer stacked sequentially;
    a first current-blocking portion partially formed on a middle portion of the light-emitting part;
    a current-conducting portion formed on the second conductivity type cladding layer and the first current-blocking portion;
    a lower electrode formed on a back side of the substrate;
    a light-reflecting layer formed between the substrate and the light-emitting part, the light-reflecting layer comprising a metal;
    a bonding layer formed between the substrate and the light-reflecting layer, the bonding layer comprising a metal;
    a partial electrode formed on a surface of the light-reflecting layer and in a portion positioned below the first current-blocking portion, the partial electrode comprising a Au-based metal; and
    a second current-blocking portion formed over the surface of the light-reflecting layer excluding a portion of the light-reflecting layer in which the partial electrode is formed, the second current-blocking portion comprising a silicon-based insulating material,
    wherein the partial electrode and the second current-blocking portion are provided between the light-emitting part and the light-reflecting layer.

2. The light-emitting diode according to claim 1, wherein a sheet resistance of the second conductivity type cladding layer is higher than a sheet resistance of the first conductivity type cladding layer.

3. The light-emitting diode according to claim 1, wherein the light-reflecting layer comprises a layer including an alloy comprising at least one of Ag, Au, or Al, or a composite layer of at least one of Ag, Au or Al.

4. The light-emitting diode according to claim 1, wherein the active layer comprises a multi-quantum-well structure.

5. The light-emitting diode according to claim 1, wherein the current-conducting portion comprises:
    a current-spreading layer provided over the first current-blocking portion and the second conductivity type cladding layer; and
    an upper electrode provided on the current-spreading layer.

6. The light-emitting diode according to claim 5, wherein the current-spreading layer comprises a transparent conductive film.

7. The light-emitting diode according to claim 1, wherein the current-conducting portion comprises a member selected from a group consisting of a current spreading portion, an upper electrode, a branching electrode, and combinations thereof.

8. The light-emitting diode of claim 1, wherein the light-reflecting layer is provided directly on opposite surfaces of the partial electrode and the second current-blocking portion, with respect to the light-emitting part.

9. The light-emitting diode of claim 1, wherein the light-reflecting layer is provided on opposite surfaces of the partial electrode and the second current-blocking portion, with respect to the light-emitting part.

10. The light-emitting diode according to claim 1, further comprising:
    first and second diffusion-inhibiting layers sandwiching the bonding layer therebetween.

11. The light-emitting diode according to claim 1, further comprising an electrode formed directly on the substrate.

* * * * *

UNITED STATES PATENT AND TRADEMARK OFFICE
CERTIFICATE OF CORRECTION

PATENT NO. : 7,728,340 B2
APPLICATION NO. : 11/484603
DATED : June 1, 2010
INVENTOR(S) : Tsunehiro Unno et al.

It is certified that error appears in the above-identified patent and that said Letters Patent is hereby corrected as shown below:

Insert the following claims in column 10, after line 43:

--12. The light-emitting diode according to claim 1, wherein the current-conducting portion comprises a branching electrode provided to come into contact with a surface of the first current-blocking portion and the second conductivity type cladding layer.

13. The light-emitting diode according to claim 1, wherein the current-conducting portion comprises:
 a branching electrode provided so as to come into contact with a surface of the first current-blocking portion and the second conductivity type cladding layer; and
 a current-spreading layer provided on the second conductivity type cladding layer so as to expose a portion of a surface of the branching electrode.

14. The light-emitting diode according to claim 1, wherein the current-conducting portion comprises:
 a branching electrode provided so as to come into contact with a surface of the first current-blocking portion and the second conductivity type cladding layer;
 a current-spreading layer provided over the second conductivity type cladding layer and the branching electrode; and
 an upper electrode provided on the current-spreading layer.

15. The light-emitting diode according to claim 13, wherein the current-spreading layer comprises a transparent conductive film.

16. The light-emitting diode according to claim 14, wherein the current-spreading layer comprises a transparent conductive film.--

Signed and Sealed this

Twenty-third Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,728,340 B2
APPLICATION NO. : 11/484603
DATED : June 1, 2010
INVENTOR(S) : Tsunehiro Unno et al.

It is certified that error appears in the above-identified patent and that said Letters Patent is hereby corrected as shown below:

Delete the title page and substitute therefore the attached title page showing the corrected number of claims in patent.

Insert the following claims in column 10, after line 43:

--12. The light-emitting diode according to claim 1, wherein the current-conducting portion comprises a branching electrode provided to come into contact with a surface of the first current-blocking portion and the second conductivity type cladding layer.

13. The light-emitting diode according to claim 1, wherein the current-conducting portion comprises:
a branching electrode provided so as to come into contact with a surface of the first current-blocking portion and the second conductivity type cladding layer; and
a current-spreading layer provided on the second conductivity type cladding layer so as to expose a portion of a surface of the branching electrode.

14. The light-emitting diode according to claim 1, wherein the current-conducting portion comprises:
a branching electrode provided so as to come into contact with a surface of the first current-blocking portion and the second conductivity type cladding layer;
a current-spreading layer provided over the second conductivity type cladding layer and the branching electrode; and
an upper electrode provided on the current-spreading layer.

15. The light-emitting diode according to claim 13, wherein the current-spreading layer comprises a transparent conductive film.

16. The light-emitting diode according to claim 14, wherein the current-spreading layer comprises a transparent conductive film.--

This certificate supersedes the Certificate of Correction issued November 23, 2010.

Signed and Sealed this

Fourteenth Day of December, 2010

David J. Kappos
*Director of the United States Patent and Trademark Office*

(12) United States Patent
Unno et al.

(10) Patent No.: US 7,728,340 B2
(45) Date of Patent: Jun. 1, 2010

(54) SEMICONDUCTOR LIGHT-EMITTING DEVICE

(75) Inventors: Tsunehiro Unno, Tsuchiura (JP); Katsuya Akimoto, Tsuchiura (JP); Masahiro Arai, Tsuchiura (JP)

(73) Assignee: Hitachi Cable, Ltd., Tokyo (JP)

(*) Notice: Subject to any disclaimer, the term of this patent is extended or adjusted under 35 U.S.C. 154(b) by 422 days.

(21) Appl. No.: 11/484,603

(22) Filed: Jul. 12, 2006

(65) Prior Publication Data
US 2007/0145381 A1 Jun. 28, 2007

(30) Foreign Application Priority Data
Dec. 22, 2005 (JP) .......................... 2005-369243

(51) Int. Cl.
H01L 31/0232 (2006.01)

(52) U.S. Cl. ............. 257/98; 257/79; 257/E33.124; 257/E33.127

(58) Field of Classification Search .......... 257/79, 257/E33.068, 98, 86, 87, E33.124, E33.127
See application file for complete search history.

(56) References Cited

U.S. PATENT DOCUMENTS

| 5,696,389 | A | * | 12/1997 | Ishikawa et al. | 257/99 |
| 6,794,688 | B2 | * | 9/2004 | Nakatsu et al. | 257/98 |
| 7,145,180 | B2 | * | 12/2006 | Shinohara et al. | 257/85 |
| 7,180,094 | B2 | * | 2/2007 | Seong et al. | 257/59 |
| 7,285,436 | B2 | * | 10/2007 | Nakatsu et al. | 438/38 |
| 2001/0011730 | A1 | * | 8/2001 | Saeki | 257/79 |
| 2005/0205886 | A1 | * | 9/2005 | Murofushi et al. | 257/98 |
| 2005/0236632 | A1 | * | 10/2005 | Lai et al. | 257/94 |
| 2009/0072257 | A1 | * | 3/2009 | Unno et al. | 257/98 |

FOREIGN PATENT DOCUMENTS
JP 2001-144322 5/2001

* cited by examiner

Primary Examiner—Davienne Monbleau
Assistant Examiner—Eduardo A Rodela
(74) Attorney, Agent, or Firm—McGinn IP Law Group, PLLC (57) ABSTRACT

A light-emitting diode has: a substrate; a light-emitting layer having a first conductivity type cladding layer, an active layer, and a second conductivity type cladding layer stacked sequentially on a front side of the substrate; a first current-blocking portion partially formed in the middle on the light-emitting layer; a current-conducting portion formed on the second conductivity type cladding layer and the first current-blocking portion; a lower electrode formed on the back side of the substrate; a light-reflecting layer formed between the substrate and the light-emitting layer; a partial electrode formed on the surface of the light-reflecting layer and in a portion positioned below the first current-blocking portion; and a second current-blocking portion formed over the surface of the light-reflecting layer excluding the portion in which is formed the partial electrode.

16 Claims, 7 Drawing Sheets